United States Patent
Aquilino et al.

(10) Patent No.: US 8,623,713 B2
(45) Date of Patent: Jan. 7, 2014

(54) TRENCH ISOLATION STRUCTURE

(75) Inventors: Michael V. Aquilino, Hopewell Junction, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/233,058

(22) Filed: Sep. 15, 2011

(65) Prior Publication Data

US 2013/0069160 A1    Mar. 21, 2013

(51) Int. Cl.
  *H01L 21/336*    (2006.01)
  *H01L 29/78*     (2006.01)
  *H01L 29/66*     (2006.01)
  *H01L 21/8238*   (2006.01)

(52) U.S. Cl.
  CPC ..... *H01L 29/66636* (2013.01); *H01L 29/66628* (2013.01); *H01L 21/823814* (2013.01); *H01L 21/823878* (2013.01)
  USPC .... 438/150; 257/190; 257/506; 257/E21.431; 257/E21.409; 257/E29.255; 438/735

(58) Field of Classification Search
  CPC ............... H01L 21/823807; H01L 21/823814; H01L 21/823878; H01L 21/76232; H01L 27/76898; H01L 27/76234; H01L 29/66636; H01L 29/0688; H01L 29/7834; H01L 29/7832
  USPC ........... 257/413, 501, 506, 513, E21.54, 190, 257/E21.431, E21.42; 438/196, 218, 296, 438/300
  See application file for complete search history.

(56) References Cited

U.S. PATENT DOCUMENTS

| | | | |
|---|---|---|---|
| 5,940,716 A | 8/1999 | Jin et al. | |
| 6,004,864 A * | 12/1999 | Huang et al. | 438/433 |
| 6,080,637 A | 6/2000 | Huang et al. | |
| 6,093,621 A * | 7/2000 | Tseng | 438/424 |
| 6,137,152 A * | 10/2000 | Wu | 257/510 |
| 6,165,871 A | 12/2000 | Lim et al. | |
| 6,242,788 B1 | 6/2001 | Mizuo | |
| 6,368,973 B1 | 4/2002 | Tseng | |
| 6,383,877 B1 * | 5/2002 | Ahn et al. | 438/296 |
| 7,119,403 B2 | 10/2006 | Doris et al. | |

(Continued)

FOREIGN PATENT DOCUMENTS

WO    2005/038875 A2    4/2005

OTHER PUBLICATIONS

Shiozawa et al., "Expansion of effective channel width for MOSFETs defined by novel T-shaped shallow trench isolation fabricated with SiON spacers and liners", Electronic Letters, May 11, 2000, vol. 36, No. 10, pp. 910-912.

(Continued)

*Primary Examiner* — John Bodnar
(74) *Attorney, Agent, or Firm* — Roberts Mlotkowski Safran & Cole P.C.

(57) ABSTRACT

A trench isolation structure and method of forming the trench isolation structure are disclosed. The method includes forming a shallow trench isolation (STI) structure having an overhang and forming a gate stack. The method further includes forming source and drain recesses adjacent to the STI structure and the gate stack. The source and drain recesses are separated from the STI structure by substrate material. The method further includes forming epitaxial source and drain regions associated with the gate stack by filling the source and drain recesses with stressor material.

23 Claims, 6 Drawing Sheets

(56) References Cited

U.S. PATENT DOCUMENTS

| | | | |
|---|---|---|---|
| 7,125,760 B1* | 10/2006 | Reese et al. | 438/154 |
| 7,163,869 B2 | 1/2007 | Kim et al. | |
| 7,205,207 B2 | 4/2007 | Doris et al. | |
| 7,396,714 B2* | 7/2008 | Chen et al. | 438/199 |
| 7,820,510 B2 | 10/2010 | Wang et al. | |
| 7,928,474 B2* | 4/2011 | Lin et al. | 257/190 |
| 2005/0124107 A1* | 6/2005 | Sumino et al. | 438/201 |
| 2008/0179626 A1 | 7/2008 | Wu et al. | |
| 2008/0237634 A1* | 10/2008 | Dyer et al. | 257/190 |
| 2010/0065941 A1* | 3/2010 | Wells et al. | 257/510 |
| 2010/0230778 A1 | 9/2010 | Wang et al. | |
| 2010/0327329 A1* | 12/2010 | Itokawa | 257/255 |
| 2012/0083088 A1* | 4/2012 | Tsai et al. | 438/300 |

OTHER PUBLICATIONS

Puzzilli et al., "T-shaped shallow trench isolation with unfilled floating void", Solid State Electronics, vol. 52, No. 8, Abstract, 2008.

Hong et al., "A Novel T-Shaped Shallow Trench Isolation Technology", Japanese Journal of Applied Physics, vol. 40, 2001, Abstract Only.

Patents Act 1977: Combined Search and Examination Report under Sections 17 and 18(3), Application No. GB1210467.5, dated Nov. 19, 2012.

Office Action for related U.S. Appl. No. 13/759,616 dated May 1, 2013.

Final Office Action for related U.S. Appl. No. 13/759,616 dated Oct. 3, 2013.

* cited by examiner

TRENCH ISOLATION STRUCTURE

FIELD OF THE INVENTION

The invention relates to semiconductor structures and, more particularly, to trench isolation structures and methods of manufacturing the same.

BACKGROUND

MOSFETs use embedded silicon germanium (eSiGe) or embedded silicon carbon (eSiC) as the source/drain stressor for PMOS or NMOS, respectively. These embedded stressors are grown epitaxially after a recess etch into the source/drain regions is performed. For a source/drain region bounded by a shallow trench isolation (STI) structure, the outer edge of the source/drain region includes the STI material (e.g., oxide) rather than the substrate material. This leads to a faceted growth of the embedded stressor material.

The faceted growth can be severe enough such that the final, grown source/drain thickness is thinner than in unbound regions (i.e., bound only by substrate material along the source/drain periphery). This leads to a greater proximity between the source/drain junction and the contact material which, in turn, leads to high junction leakage. Also, the reduced volume resulting from the faceted growth leads to reduced stress, which reduces device performance.

In order to circumvent these penalties, an STI edge can be tucked under an adjacent dummy gate. This dummy gate effectively serves as a spacer to mask some substrate material adjacent to the STI edge during the source/drain recess etch, such that subsequent epitaxial growth is bound by substrate material on all sides (leading to the desired epitaxial growth). In this approach, though, the dummy gate imposes an additional parasitic capacitance to the source/drain regions, which increases circuit delay and dynamic power consumption. Moreover, a layout area penalty is imposed, since the active region spacing is linked to the gate pitch. Also, this approach is a 1-D solution in that it only resolves the faceting issue in the length direction (i.e., in the direction perpendicular to the gate) but not the width direction.

Accordingly, there exists a need in the art to overcome the deficiencies and limitations described hereinabove.

SUMMARY

In an aspect of the invention, a method comprises forming a shallow trench isolation (STI) structure having an overhang and forming a gate stack. The method further comprises forming source and drain recesses adjacent to the STI structure and the gate stack. The source and drain recesses are separated from the STI structure by substrate material. The method further comprises forming epitaxial source and drain regions associated with the gate stack by filling the source and drain recesses with stressor material.

In an aspect of the invention, a method comprises forming an opening in one or more layers formed on a substrate and forming a recess within the substrate, in alignment with the opening. The method further comprises forming sidewall spacers on exposed portions of the recess and opening and forming a trench within the substrate, in alignment with the recess. The method further comprises filling the trench and unfilled portions of the recess with an insulator material to form a shallow trench isolation (STI) structure. The method further comprises removing the one more layers and an upper portion of the sidewall spacers to form an overhang of the STI structure. The method further comprises forming source and drain recesses adjacent to the STI structure and under the overhang, which is bounded by portions of the substrate under the overhang. The method further comprises filling the source and drain recesses with stressor material to form epitaxial source and drain regions.

In an aspect of the invention, a structure comprises a shallow trench isolation (STI) structure having an overhang in a substrate and source and drain recesses adjacent to the STI structure and bounded by substrate material. The structure further comprises epitaxial source and drain regions filling the source and drain recesses with stressor material and bounded by the substrate material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the trench isolation structures which comprises the structures of the present invention. In still further embodiments, a method in a computer-aided design system is provided for generating a functional design model of the trench isolation structures. The method comprises generating a functional representation of the structural elements of the trench isolation structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to trench isolation structures and methods of manufacturing the same. More specifically, the present invention is directed to trench isolation (STI) structures that include an overhang, in order to preserve substrate material near the STI structure during source and drain etching processes. Advantageously, by using the overhang, source and drain etching processes will not remove all of the substrate material, near the STI structure. The substrate material, in turn, provides a seed layer for stressor material which forms epitaxial source and drain regions. The epitaxial source and drain regions can be raised source and drain regions. Accordingly, the invention offers a means of minimizing the faceted epitaxial growth in all directions, while eliminating the parasitic capacitance and reducing or eliminating the layout area penalty associated with the active-tuck-under-dummy-gate solution.

More specifically, in the present invention a shallow STI recess is formed within the substrate. The sidewalls of the STI recess are lined with a spacer sidewall material, e.g., nitride spacers, which can be engineered to narrow a window (e.g., recess) for subsequent STI etching processes. A subsequent etch is performed within the substrate (through the window) to form the remaining STI trench. The STI trench is then filled with insulator material, resulting in a T-shaped STI structure (e.g., a combination of insulator material within the STI trench and the spacer sidewall material). Thus, in this approach, the length and thickness of an overhang region (which forms the T shape) is defined, respectively, by the STI spacers and shallow STI etch, respectively. The result is an STI edge that is underlapped by the top STI overhang region. This achieves a structure whereby the substrate material remains along the majority of the STI sidewall, without the need to tuck the STI region under a dummy gate.

In other words, the present invention effectively eliminates the need for tucking the STI region under a dummy gate, thereby avoiding a layout area penalty. Instead, the STI region is effectively tucked under itself. Also, the present invention reduces junction leakage and increases the stress component in the source/drain regions compared to conventional structures which, in turn increases device performance.

Figure 1:
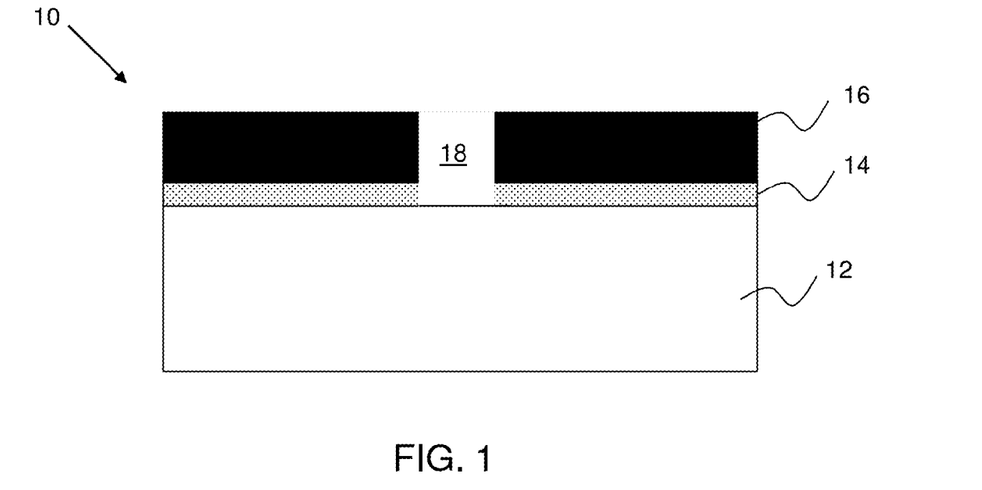
FIGS. 1-8 show structures and respective processing steps in accordance with aspects of the present invention.

FIG. 1 shows a structure and respective processing steps in accordance with aspects of the present invention. In particular, the structure 10 includes a substrate 12. In embodiments, the substrate can be, for example, BULK Si. An insulator layer 14 is formed on the substrate 12. In embodiments, the insulator layer 14 can be oxide, which is thermally grown on the substrate 12. The insulator layer 14 can be grown to a thickness of about 2 nm to about 5 nm; although other dimensions are also contemplated by the present invention (to form a raised STI structure as discussed with reference to FIG. 9). A hardmask 16 is formed on the insulator layer 14. The hardmask 16 can be, for example, nitride; although other materials are also contemplated by the present invention. In embodiments, additional materials can be formed on the hardmask 16 to act as an etch mask during formation of an STI structure.

Still referring to FIG. 1, an opening 18 is formed through the hardmask 16 and the insulator layer 14. The opening 18 can be formed using conventional lithographic and etching processes, to define an STI region. For example, a resist can be formed on the hardmask 16 and exposed to light to form a pattern (i.e., opening). A reactive ion etching (RIE) can be performed to form the opening 18. The resist can be removed using a conventional ashing process. In embodiments, the opening 18 can be about 40 nm to about 100 nm in cross section; although other dimensions are also contemplated by the present invention depending on the technology node and other design variables such as, for example, a required processing window for subsequent STI etching processes.

Figure 2:
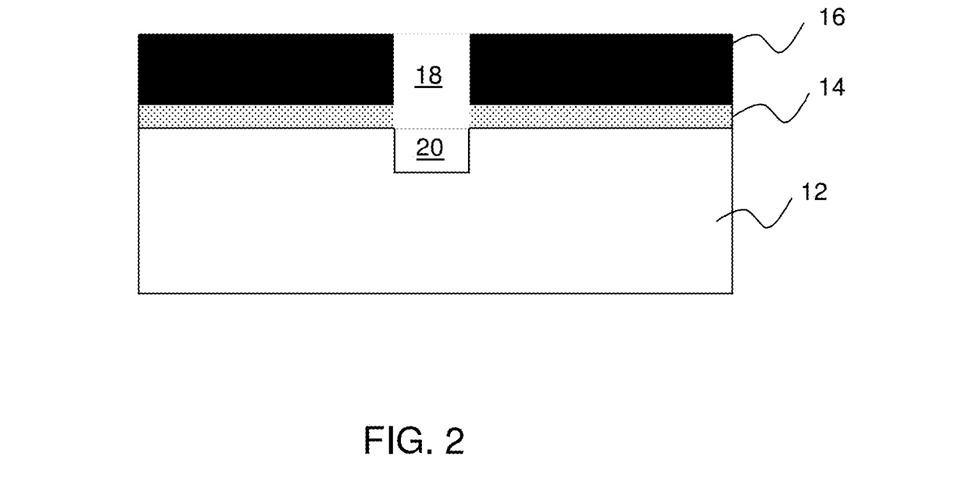

FIG. 2 shows a structure and additional processing steps in accordance with aspects of the present invention. More specifically, FIG. 2 shows an etching process to form a shallow recess 20 in the substrate 12. In embodiments, the shallow recess 20 can be about 10 nm. In embodiments, the recess 20 can be formed by a timed etching process. For example, in embodiments, the exposed substrate 12 can be implanted with an N-type dopant such as phosphorus, arsenic, or antimony. The structure can then undergo an annealing process at about 900° C. to about 1100° C. for a specified time, e.g., a millisecond to about 1 or more seconds (depending on the anneal tool). After annealing, the recess 20 can be selectively etched using, for example, chlorine chemistries.

In embodiments, the initial recess etch will define a facet of a source/drain epitaxial growth. For example, a PMOS embedded stressor (e.g., SiGe or SiC) region extends about 30 nm to about 50 nm into the substrate 12 (depending on the desired stressor material shape). With a conventional STI process flow, there will be very little stressor material grown along the STI sidewall (where no Si exists to act as a seed layer). Thus, the stressor facet extending from the STI edge will begin at the bottom of the stressor region. The thickness of the stressor material along the STI sidewall will therefore not be 30 nm to 50 nm; but instead defined by the growth rate of stressor material along the facet. In the illustrative example shown herein, a 10 nm recess etch would result in the stressor faceting starting at 10 nm below the surface rather than at the 30 nm to 50 nm depth defined by the stressor recess etch, thus increasing the stressor material thickness along the STI edge by about 20 nm to 40 nm.

Figure 3:
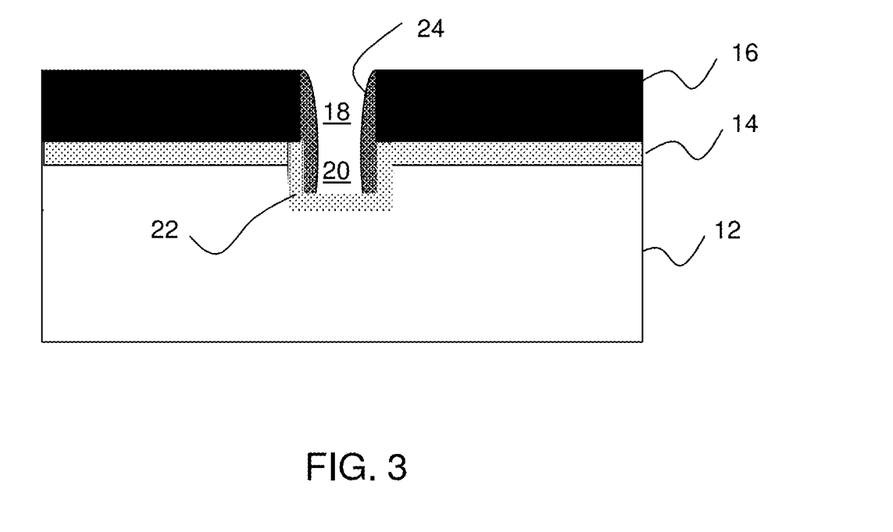

FIG. 3 shows a structure and additional processing steps in accordance with aspects of the present invention. More specifically, FIG. 3 shows the formation of STI spacer sidewalls 24 which extends into the recess 20. FIG. 3 also shows an optional insulator liner 22 formed within the recess 20. In embodiments, the optional insulator liner 22 is an oxide, which can be grown on exposed surfaces of the substrate 12 within the recess 20. The insulator liner 22 will improve the interface of a P-N junction, e.g., reduce diode leakage due to broken bonds at the interface STI boundary. In embodiments, the insulator liner 22 is about 2 nm to about 5 nm; although other dimensions are contemplated by the present invention. In additional embodiments, a liner can be formed on the hardmask 16. The liner can be an oxidized nitride formed from the liner oxide growth.

The STI spacer sidewalls 24 can be formed by conventional deposition methods such as chemical vapor deposition (CVD) processes. The STI spacer sidewalls 24 can be nitride, oxide or other insulator materials, e.g., amorphous carbon, which has very high etch selectivity over silicon, nitride, and oxide and so would be subject to a smaller lateral etch during the STI etch, thus increasing the process window.

The thickness of the STI spacer sidewalls 24 will define the dimensions of the overhang 34 of a T-shaped STI structure 35. In embodiments, the thickness of the STI spacer sidewalls 24 can range from about 10 nm to about 20 nm; although other dimensions are contemplated by the present invention as described below. The STI spacer sidewalls 24 can be engineered to narrow a window (e.g., recess) for subsequent STI etching processes, and can also be used to adjust a length of an overhang of the STI structure.

It should be understood by those of skill in the art that the STI spacer sidewalls 24 will reduce the remaining STI length. Thus, the initial STI length may need to be increased to account for this effect. In an illustrative, non-limiting example, minimum STI length is about 70 nm (perpendicular to the gate). By adding the STI spacer sidewalls 24, this length is reduced by about 14 nm on each side, i.e., to about 42 nm. In the other direction (i.e., parallel to the gate), the minimum STI length is about 50 nm, which means the STI length is reduced to about 20 nm. In an SRAM cell, as another illustrative, non-limiting example, the minimum STI length is about 40 nm, which means the STI length is reduced from about 40 nm to about 12 nm.

Figure 4:
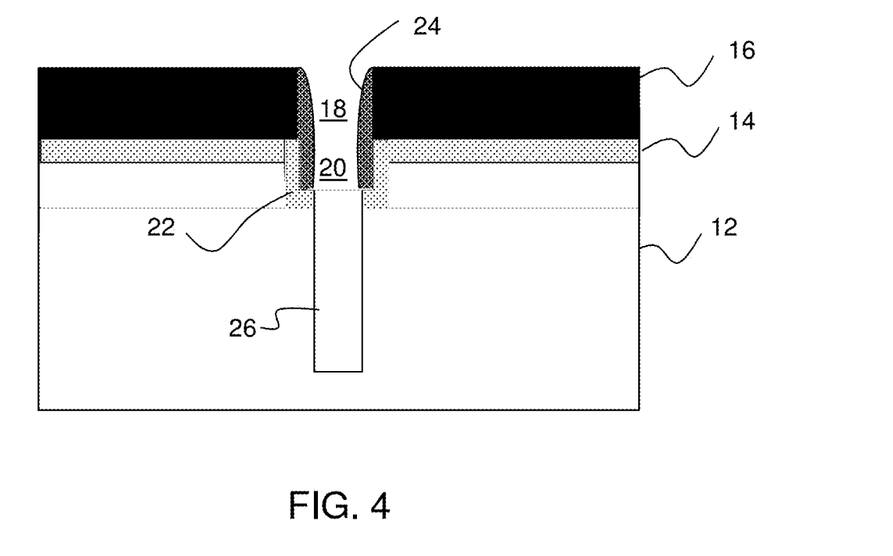

In FIG. 4, a deep trench 26 is etched into the substrate 12, through the processing window formed by the STI spacer sidewalls 24. In embodiments, the deep trench 26 can be formed by conventional etching processes (RIE), which also removes the liner on the hardmask 16. The deep trench 26 can be about 200 nm deep with a cross section of about 20 nm to about 60 nm to achieve a desired final STI depth and cross section. It should be understood by those of skill in the art that other dimensions are also contemplated by the present invention depending on the technology node, substrate material and other design factors.

Figure 5:
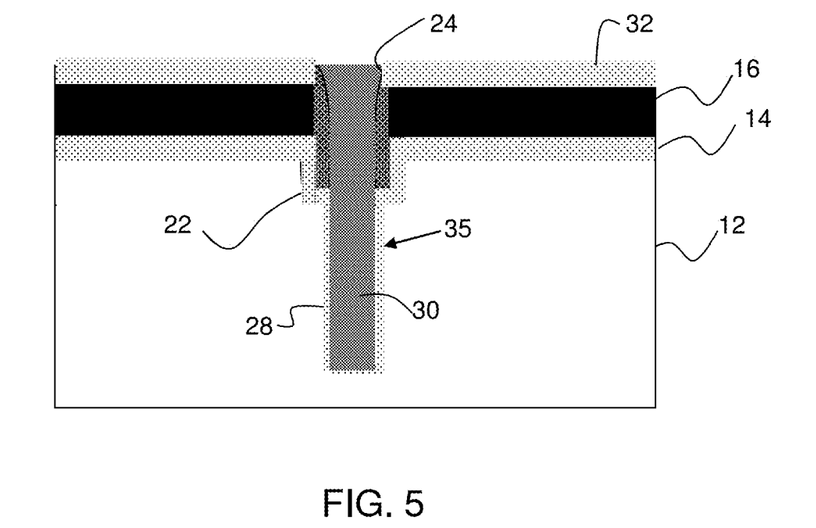

In FIG. 5, an optional insulator liner 28 is grown on the sidewalls of the deep trench 26. In embodiments, the insulator liner 28 is an oxide, grown to about 2 nm to about 5 nm; although other dimensions are contemplated by the present invention. As noted above, the insulator liner 28 will improve the interface of a P-N junction, e.g., reduce diode leakage due to broken bonds at the interface STI boundary.

The trench 26 is filled with an insulator material 30 such as oxide to form an STI structure 35. The insulator material 30 can be deposited within the trench 26 using a CVD process. The structure also includes an oxidized nitride layer 32, formed during the deposition of the insulator material 30. As a further alternative, the present invention contemplates the nitride surface being oxidized during the growth of the liner 28, and then a blanket, conformal deposition of layer 30. In embodiments, the insulator material 30 and layer 32 are planarized using a chemical mechanical polishing (CMP). In embodiments, the CMP may completely remove the layer 32, exposing a surface of the hardmask 16.

Figure 6:
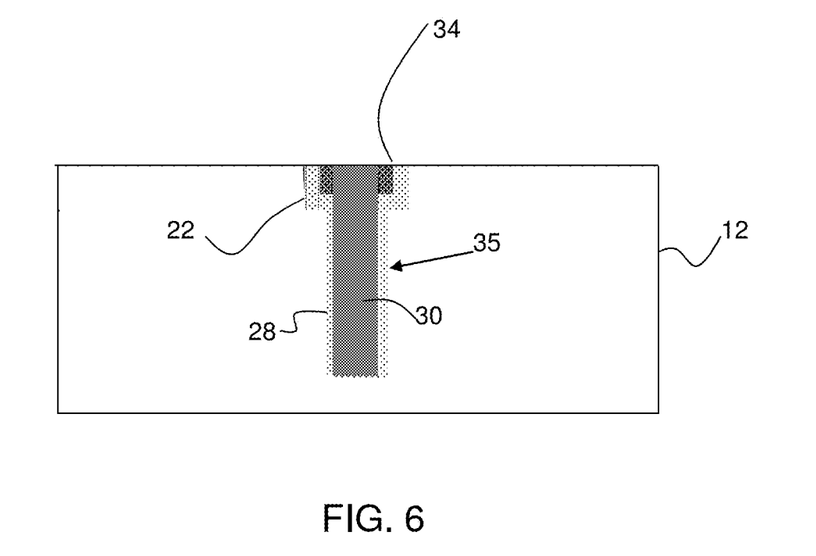

In FIG. 6, any remaining oxidized nitride is removed, permitting the removal of the hardmask layer 16. The hardmask layer 16 can be removed using a CMP process. In embodiments, CMP process will also remove the insulator layer 14, and portions of the STI sidewall spacers, leaving behind an overhang 34 of the STI structure 35. The remaining spacers (i.e., overhang 34) are now planar with the substrate 12 (or the insulator layer 14, if not previously removed). Accordingly, after planarization processes, an STI structure 35 is formed, with a "T" shape (i.e., overhang 34 forming a horizontal branch of the T shape). Substrate material is provided under the overhang 34.

Figure 7:
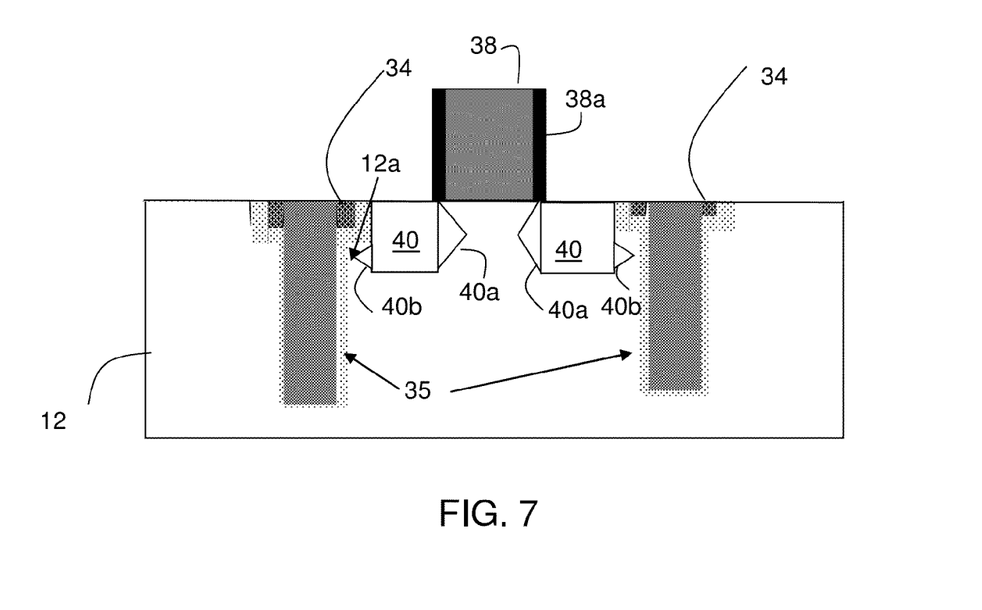

FIG. 7 shows an additional structure with respective processing steps in accordance with aspects of the present invention. More specifically, a conventional gate stack 38 is formed on the insulator layer 14. In embodiments, the gate stack 38 can be formed using a gate first process or a gate last process, known to those of skill in the art. For example, in the gate first process, gate stack material is deposited on the insulator layer 14. The gate stack material is then patterned using conventional patterning processes, to form the gate stack 38. Sidewall spacers 38a can then be deposited on the sidewalls of the gate stack 38 using conventional materials, e.g., nitride, and processes, e.g., CVD. In a gate last process, a poly dummy gate can be first formed, then removed (later in the process flow) using conventional etchants (RIE). The gate stack 38 can then be formed.

Still referring to FIG. 7, source and drain recesses 40 are formed using etching processes. More specifically, in embodiments, the source and drain recesses 40 are formed using a sigma etch to define a faceted recesses 40a and 40b. In embodiments, the etchant can be a wet chemistry such as ammonium hydroxide which will stop etching on the 111 crystal plane to provide the sigma (faceted) shape. The faceted shape includes a portion 40a under the gate stack 38 and a portion 40b under the overhang 34 of the STI structure 35. As shown, though, substrate material 12a remains on the side of the STI structure 35 and under the overhang 34. In alternative embodiments, the source and drain recesses 40 are formed using conventional etching processes. In embodiments, the etching can be an anisotropic etch. In any etching scenario, substrate material 12a will be remain under the overhang 34, which will act as a seed layer for subsequent stressor material growth.

As should be understood, the STI spacer thickness is large enough to account for the lateral sigma etch (if one is performed) for forming embedded source/drain stressors, plus any lateral etch that takes place during the final STI etch, in order to preserve some amount of substrate 12a adjacent to the STI structure 35 under the T-shape, i.e. overhang 34. The initial STI recess etch effectively defines the point at which epi faceting will occur. Thus, the shallower the etch, the higher up the faceting takes place and the more the epitaxial source/drain region will resemble an epitaxial source/drain region placed between two gate electrodes (i.e., the ideal source/drain shape).

In embodiments, if the PMOS embedded SiGe (or other stressor material) region has a "sigma" (e.g., faceted) shape, then the SiGe recess etch is followed by an additional etch to form the sigma shape. This additional etch undercuts the gate sidewall spacer and is optimized to place the sigma tip in a specific location. Likewise, this etch will also undercut the substrate 12 under a top of the T-shaped STI. Accordingly, if the STI spacer sidewalls 24 are not thick enough, the sigma etch for the SiGe process will expose the STI sidewall, thus eliminating the seed layer that may exist along the sidewall (formed by the "protected" substrate material 12). Thus, the STI spacer sidewalls 24 should be equal in thickness to the gate sidewall spacers, plus some extra thickness to account for lateral etching during the remaining STI etch. In an example, the gate sidewall spacer thickness can be about 10 nm when the SiGe regions are defined, and the sigma tip has a target gate overlap of about 1 nm; meaning the total lateral etch is about 11 nm. Also, the target lateral nitride etch during the STI etch is about 3 nm. Thus, in the example shown, the STI spacer sidewalls 24 can have a target thickness of about 14 nm.

Figure 8:
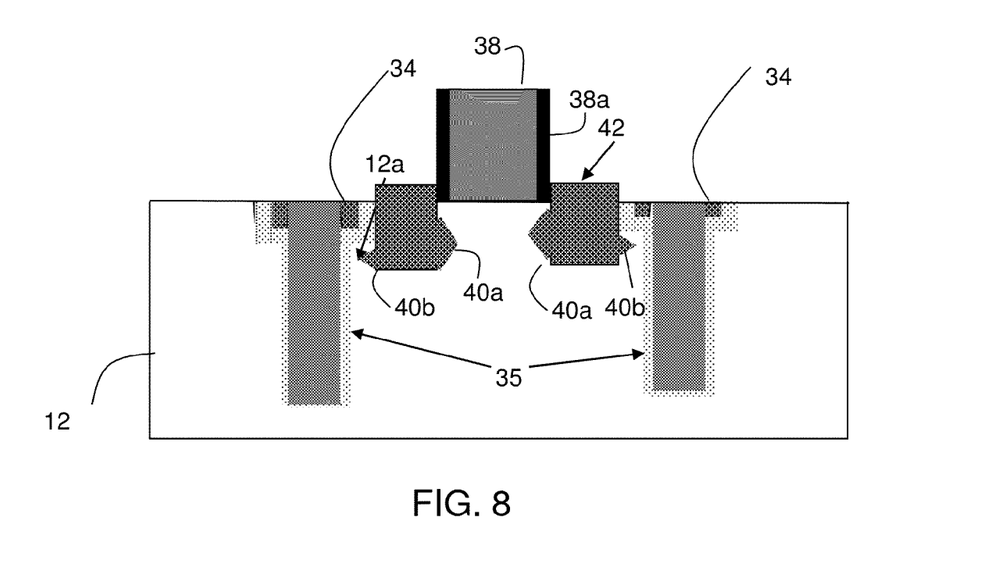

In FIG. 8, the faceted recesses 40 are filled with stressor material 42. The stressor material 42 can be used to create a epitaxial source/drain stressors. In embodiments, the stressor material 42 can be grown SiGe or SiC. Advantageously, the substrate material 12a between the faceted recesses 40 and the STI structure 36, will act as a seed layer for the stressor material 42. This will decrease junction leakage, improve stress imposed in the source/drain regions, and decrease any layout penalties.

Figure 9:
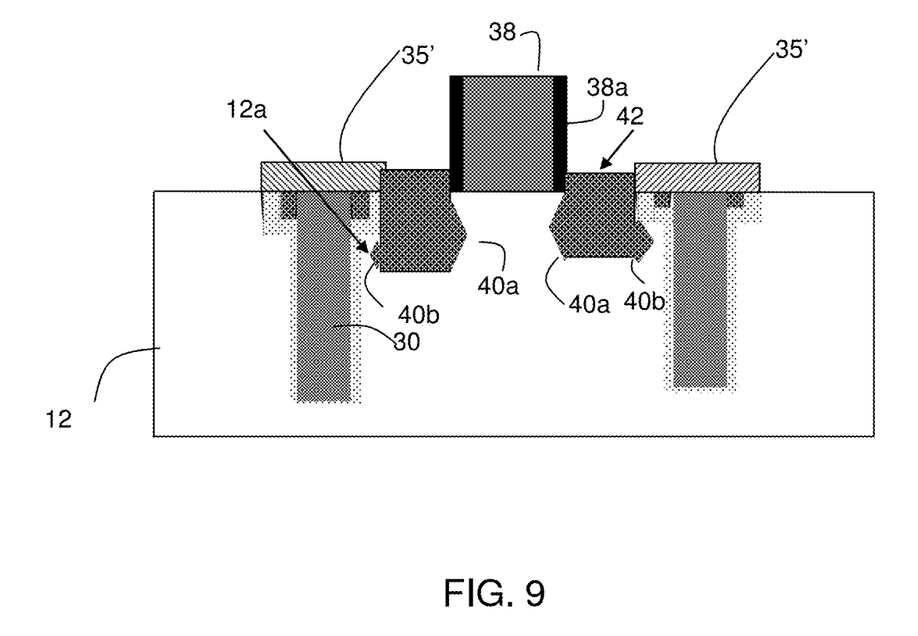
FIG. 9 shows an alternate structure and respective processing steps in accordance with aspects of the present invention.

FIG. 9 shows an alternate structure in accordance with aspects of the present invention. More specifically, FIG. 9 shows a raised STI structure 35'. The raised STI structure 35' can be manufactured by making the insulator layer 14 thicker, and then continuing with the remaining processing steps shown in FIGS. 1-8. Alternatively, the recess 20 can be made deeper in order to form larger sidewall spacers 24 (which form the overhang 34) in FIG. 3, and continuing with the remaining processes shown in FIGS. 4-8. In still another alternative approach, in FIG. 6, a selective etchant can be used to remove Si (e.g., substrate material 12), which would not substantially affect the sidewall spacers 24 or other materials. In this way, the sidewall spacers 24 will not be etched away, or substantially etched away, thus providing a raised STI structure 35', after the substrate etch. The processes would then continue with the processing steps shown in FIGS. 7 and 8.

Figure 10:
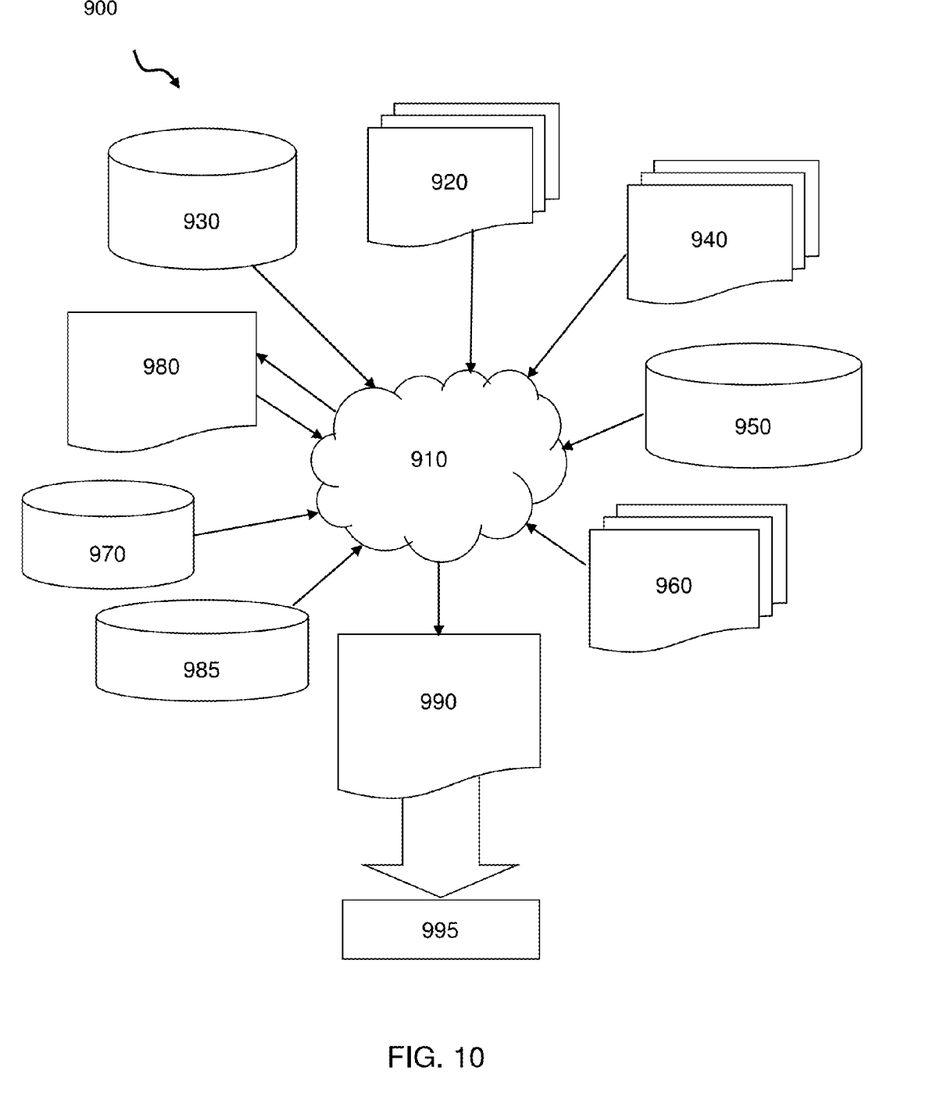
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method comprising:
    forming a shallow trench isolation (STI) structure having an overhang which comprises forming a shallow recess of a first dimension in a substrate material followed by a trench of a second dimension formed in the substrate material;
    forming a gate stack;
    forming source and drain recesses adjacent to the STI structure and the gate stack, wherein the source and drain recesses are separated from the STI structure by the substrate material under the overhang; and
    forming epitaxial source and drain regions associated with the gate stack by filling the source and drain recesses with stressor material such that the stressor material is formed under the overhang and stressor material under the overhang is separated from the STI structure by the substrate material.

2. The method of claim 1, wherein forming the overhang Comprises
    forming sidewall spacers within the shallow recess.

3. The method of claim 2, wherein the shallow recess is formed to a depth about 10 nm within the substrate.

4. The method of claim 2, further comprising removing upper portions of the sidewall spacers.

5. The method of claim 2, wherein the sidewall spacers are insulator material.

6. The method of claim 2, wherein forming the shallow recess comprising:
    implanting a dopant into an exposed portion of a substrate, through an opening in layers above the substrate;
    annealing the substrate; and
    selectively etching the substrate using a chlorine chemistry.

7. The method of claim 6, wherein the annealing is about 900 ° C. to about 1100 ° C.

8. The method of claim 7, wherein the dopant is an N-type dopant comprising one of phosphorus, arsenic, and antimony.

9. The method of claim 1, wherein forming the source and drain recesses includes forming facets along a side of the STI structure, bounded by the substrate material.

10. The method of claim 9, wherein forming the epitaxial source and drain regions comprises growing SiGe or SiC within the source and drain recesses, where the substrate material acts as a seed layer for the growing of the SiGe or SiC.

11. The method of claim 1, wherein the overhang is formed as a raised overhang portion.

12. A method, comprising:
    forming an opening in one or more layers formed on a substrate;
    forming a recess within the substrate, in alignment with the opening;
    forming an insulator liner on sidewalls of the recess;
    forming sidewall spacers on the insulator liner with portions of the recess and opening;
    forming a trench within the substrate, in alignment with the recess;
    filling the trench and unfilled portions of the recess with an insulator material to form a shallow trench isolation (STI) structure;
    removing the one or more layers and an upper portion of the sidewall spacers to form an overhang of the STI structure;
    forming faceted source and drain recesses adjacent to the STI structure and under the overhang, which is bounded by portions of the substrate under the overhang; and
    filling the faceted source and drain recesses with stressor material to form epitaxial source and drain regions such that the stressor material is separated from the STI structure under the overhang and the substrate acts as a seed layer for epitaxial growth of the stressor material at an interface of the faceted source and drain recesses at least under the overhang.

13. The method of claim 12, wherein forming the recess comprises:
    implanting an N-type dopant into an exposed portion of the substrate, through the opening;
    annealing the substrate; and
    selectively etching the substrate using a chlorine chemistry.

14. The method of claim 13, wherein:
    the annealing is about 900 ° C. to about 1100 ° C.; and
    the N-type dopant is phosphorus, arsenic, or antimony.

15. The method of claim 12, wherein forming the source and drain recesses includes forming facets along a side of the STI structure, bounded by substrate material.

16. The method of claim 15, wherein forming the epitaxial source and drain regions includes growing SiGe or SiC within the recesses, where the substrate material bounding the source and drain recesses acts as a seed layer for growing of the SiGe or SiC.

17. The method of claim 12, wherein the overhang is formed as a raised overhang portion.

18. The method of claim 12, wherein the recess is formed to a depth about 10 nm within the substrate.

19. The method of claim 1, wherein:

forming the source and drain recesses comprises forming faceted source and drain recesses using a sigma etch such that facets of the faceted source and drain recesses are provided under the overhang and separated from the overhang by the substrate material;

filling the faceted source and drain recesses with stressor material which is epitaxially grown using the substrate material at an interface of the faceted source and drain recesses at least under the overhang as a seed layer for the growth process; and the stressor material is formed separated from the STI structure under the overhang.

20. The method of claim 19, further comprising forming an insulator liner on sidewalls of the shallow recesses, which is formed by an oxide growth process on the substrate material.

21. The method of claim 20, further comprising forming a spacer material on the insulator liner, the spacer material defining the second dimension of the trench.

22. The method of claim 21, wherein the overhang is formed as a raised overhang portion by selective removing the substrate material on sides of the shallow recess.

23. The method of claim 21, wherein the spacer material is larger in thickness than gate sidewall spacers.

* * * * *